United States Patent [19]
Barrett, Jr. et al.

[11] Patent Number: 5,363,061
[45] Date of Patent: Nov. 8, 1994

[54] OPERATIONAL TRANSCONDUCTANCE AMPLIFIER WITH MATCHED OUTPUTS

[75] Inventors: Raymond L. Barrett, Jr., Ft. Lauderdale; Barry W. Herold, Boca Raton; Grazyna A. Pajunen, Delray Beach, all of Fla.

[73] Assignee: Motorola, Inc., Schaumburg, Fla.

[21] Appl. No.: 152,991

[22] Filed: Nov. 10, 1993

[51] Int. Cl.$^5$ ............................................. H03F 3/68
[52] U.S. Cl. ................................. 330/288; 330/310; 330/295
[58] Field of Search ............... 330/277, 288, 307, 310, 330/295; 455/260, 341, 343

[56] References Cited

U.S. PATENT DOCUMENTS 5,142,696  8/1992  Kosiec et al. .................. 455/260
5,165,054 11/1992  Platt et al. .................. 330/288 X

OTHER PUBLICATIONS

"Analog MOS Integrated Circuits For Signal Processing" by R. Gregorian and G. Temes. Copyright 1986 by John Wiley & Sons, Inc. Reference pages are 251-257, 126-135 and 157-172.

Primary Examiner—Steven Mottola

[57] ABSTRACT

A multi-output integrated circuit amplifier (500) consists of a first primary current mirror (510), and a plurality of secondary current mirrors (520). The first primary current mirror (510) implemented in a single substrate and having a first primary input (511). The first primary current mirror (510) generates a plurality of first inverted primary current outputs in response to a first current signal coupled to the first primary input (511). The plurality of secondary current mirrors are implemented in the same single substrate and each has a secondary input coupled to a unique one of the plurality of primary current outputs of the first primary current mirror (510), each of said plurality of secondary current mirrors (520) having a gain, and each of said plurality of secondary current mirrors (520) generating an inverted secondary current output signal, the magnitude of which is determined substantially by the unique one of the plurality of primary current outputs coupled thereto and the gain thereof.

7 Claims, 5 Drawing Sheets

OPERATIONAL TRANSCONDUCTANCE AMPLIFIER WITH MATCHED OUTPUTS

FIELD OF THE INVENTION

This invention relates in general to electronic amplifier circuits and in particular to current amplifier circuits having multiple outputs.

BACKGROUND OF THE INVENTION

In portable battery operated products such as a radio frequency communication device, it is desirable to have the lowest possible overall current drain in order to maximize battery life. Moreover, it is desirable to operate such products at the lowest possible voltage so as to minimize their total power consumption.

Conventional radio frequency communication devices may use one or more application specific integrated circuits to implement functions such as phase lock loops to synthesize frequencies needed for digital logic or radio frequency circuits. To conserve power, a synthesizer or other circuitry implemented in an application specific integrated circuit should generally be operated using as low a voltage as possible. Moreover, to conserve even more power, these circuits may be operated in a power saving mode where one or more of the circuits are switched on during active processing periods (e.g., signal transmission or reception, data storage, retrieval, or presentation) and off during "sleep" or "rest" periods. Operating in this fashion, a portable battery operated product can substantially increase available battery life, thus resulting in more "talk time" in a radio frequency communication device such as a cellular telephone or the like.

In the past, low voltage circuitry implemented in application specific integrated circuits typically consisted of bipolar analog or I$^2$L (integrated injection logic) logic circuits. These bipolar circuits experienced problems such as poor high speed operation (I$^2$L operating at 0.25 $\mu$A per gate is typically operational to only around 50 KHz), a lack of dynamic range (conventional low bipolar analog circuits have a saturation point of typically 200 mV, yielding a range of less than 600 mV from a one volt supply), and extreme variation of their intrinsic operating characteristics over temperature.

Thus, what is needed is low voltage CMOS (complimentary metal oxide semiconductor) process and appropriate circuit topologies that allow a designer to achieve both analog and digital functions using an application specific integrated circuit in a radio frequency communication device. As such, the low voltage CMOS designs would operate at significantly lower power levels than comparable bipolar designs. Moreover, when operated in a power saving mode, the CMOS designs can more effectively conserve power while offering improved circuit performance characteristics.

SUMMARY OF THE INVENTION

Accordingly, in a first aspect of the present invention, a multi-outpost integrated circuit amplifier consists of a first primary current mirror, and a plurality of secondary current mirrors. The first primary current mirror consists of complementary metal oxide semiconductor field effect transistors implemented in a single substrate having a first primary input. The first primary current mirror generates a plurality of first inverted primary current outputs in response to a first current signal coupled to the first primary input. The plurality of secondary current mirrors consists of complementary metal oxide semiconductor field effect transistors implemented in the same single substrate, each having a secondary input coupled to a unique one of the plurality of primary current outputs of the first primary current mirror, each of said plurality of secondary current mirrors having a gain, and each of said plurality of secondary current mirrors generating an inverted secondary current output signal, the magnitude of which is determined substantially by the unique one of the plurality of primary current outputs coupled thereto and the gain thereof.

DETAILED DESCRIPTION OF THE INVENTION

Figure 1:
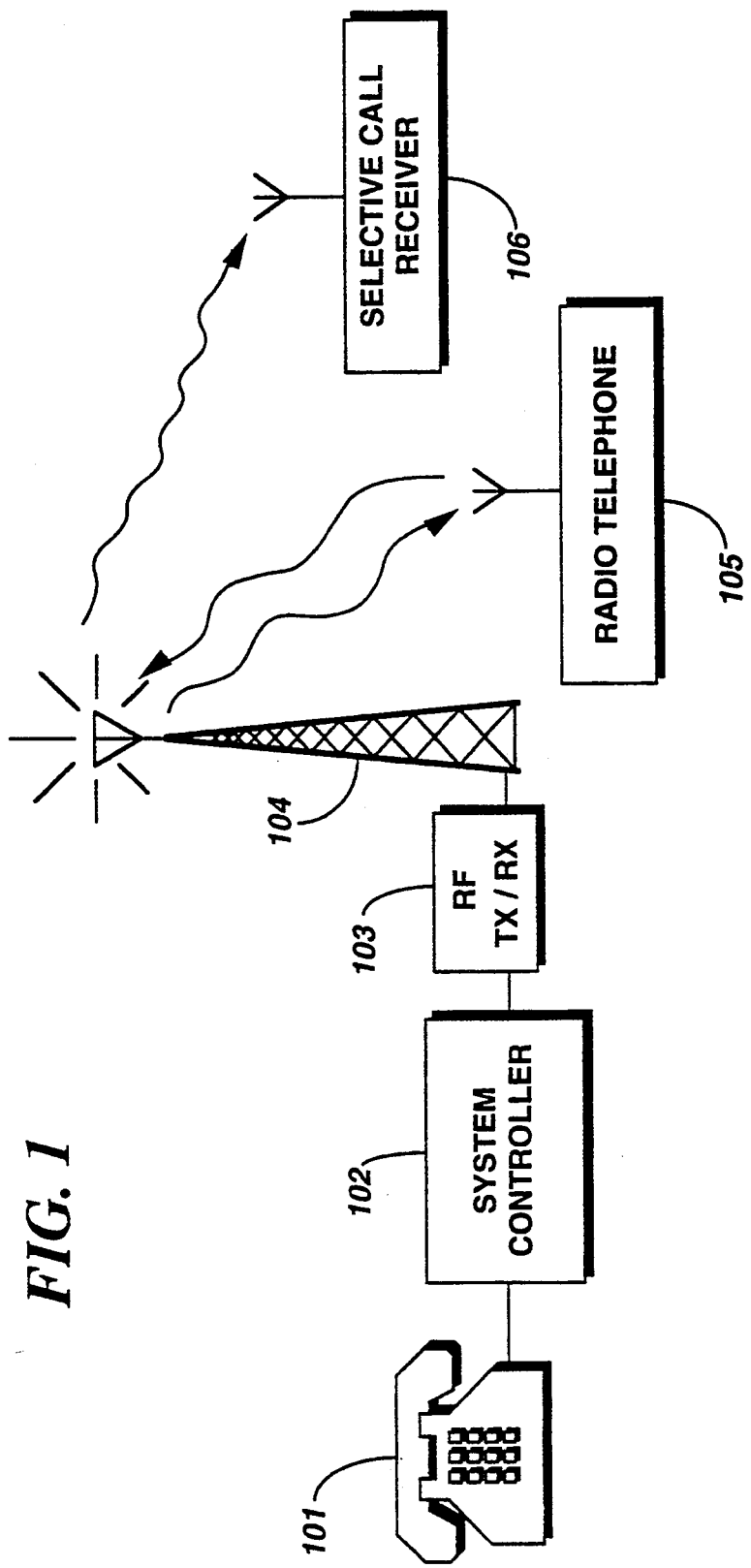
FIG. 1 is a block diagram of a radio frequency communication system suitable for use with the present invention.

Referring to FIG. 1, the preferred embodiment of a radio communication system comprises a telephone 101 connected by a conventional public switched telephone network (PSTN) to a system controller 102 which may oversee operation of a radio frequency transmitter/receiver 103 and which encodes and decodes the inbound and outbound addresses into formats that are compatible the respective land line and cellular radio telephone addressing requirements. The system controller 102 can also function to encode paging messages for transmission by the radio frequency transmitter/receiver 103. Telephony signals are transmitted to and received from a radio telephone 105 by at least one antenna 104 coupled to the radio frequency transmitter/receiver 103. The radio frequency transmitter/receiver 103 may also be used to transmit paging messages to an optional selective call receiver 106.

It should be noted that the system controller 102 is capable of operating in a distributed transmission control environment that allows mixing cellular, simulcast, master/slave, or any conventional wide and local area coverage scheme. Moreover, as one of ordinary skill in the art would recognize, the telephonic and paging functions may reside in separate system controllers that may operate either independently or in a networked fashion.

Figure 2:
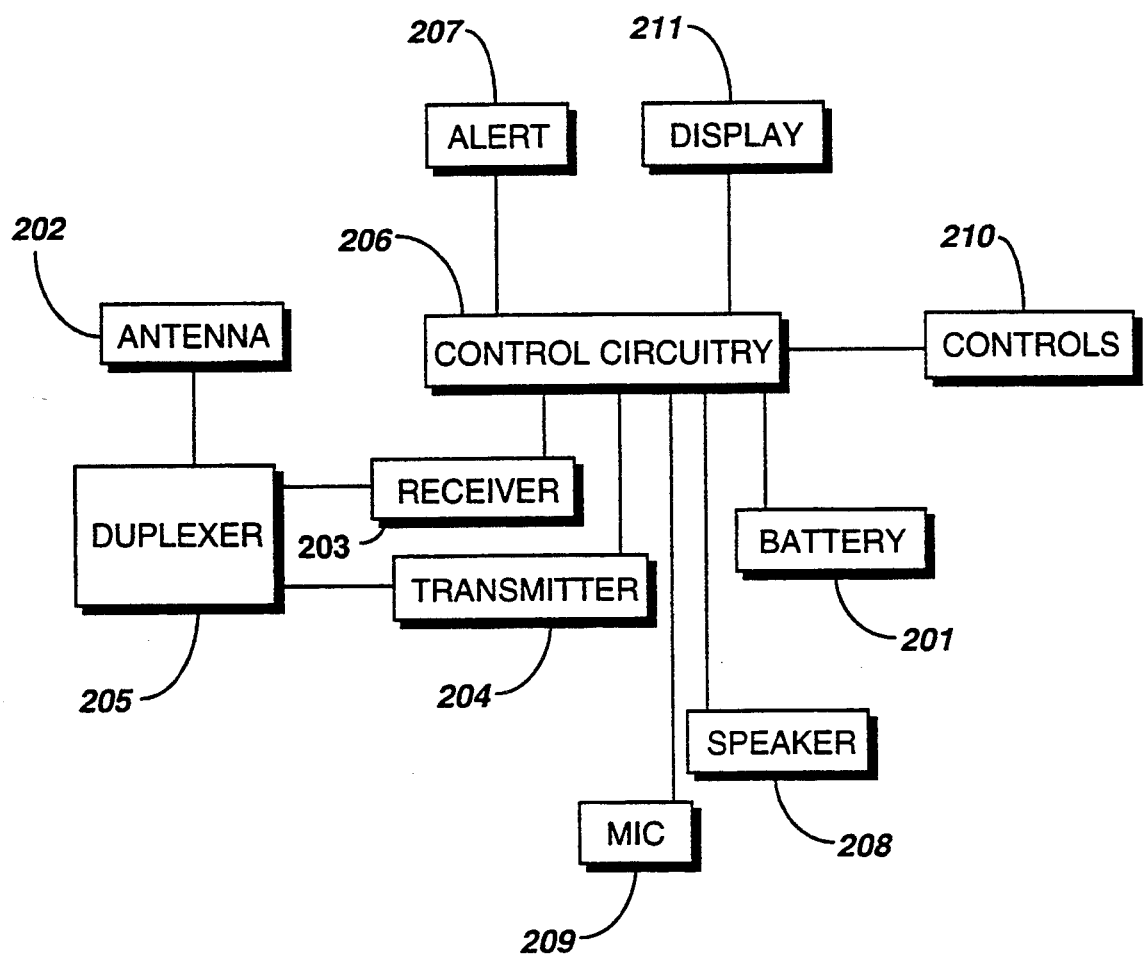
FIG. 2 is a block diagram of a radio telephone depicted in FIG. 1 system suitable for use with the present invention.

Referring to FIG. 2, a block diagram is shown of a battery 201 powered radio telephone. A radio frequency signal is received at a earner frequency and/or transmitted by an antenna 202. The antenna is coupled to a receiver 203 and a transmitter 204 by a duplexer 205. The received signal is filtered and demodulated by the receiver 203, and the demodulated signal is coupled from the receiver 203 to a control circuitry 206 for recovering any information contained within the received signal. The control circuit 206 also generates a local oscillator reference frequency using a phase lock loop frequency synthesizer, and also generates a plurality of filter control signals coupled to the receiver 203 to control the filtering in the receiver 230. The recovered information is then used by the control circuit to activate an alert 207 (a ringer in the case of a cellular radio telephone), and after answering the call, to sustain a telephone connection. When the telephone connection is completed, the user may audibly communicate with another party via a speaker 208 and a microphone 209. The control circuitry 206 routes recovered audio to the speaker 208 which converts electrical energy into acoustical energy thus enabling the user to hear any communications. The microphone 209 is used to convert acoustic energy into electrical energy for use by the control circuitry 206 in modulating the radio frequency carrier produced by the transmitter 204.

The user may initiate a call by selecting a proper control 210 and entering a number of a party to be contacted. When entering and sending, the number may be presented on a display 211 to provide the user with visual feedback confirming the number entered and subsequently sent.

Figure 3:
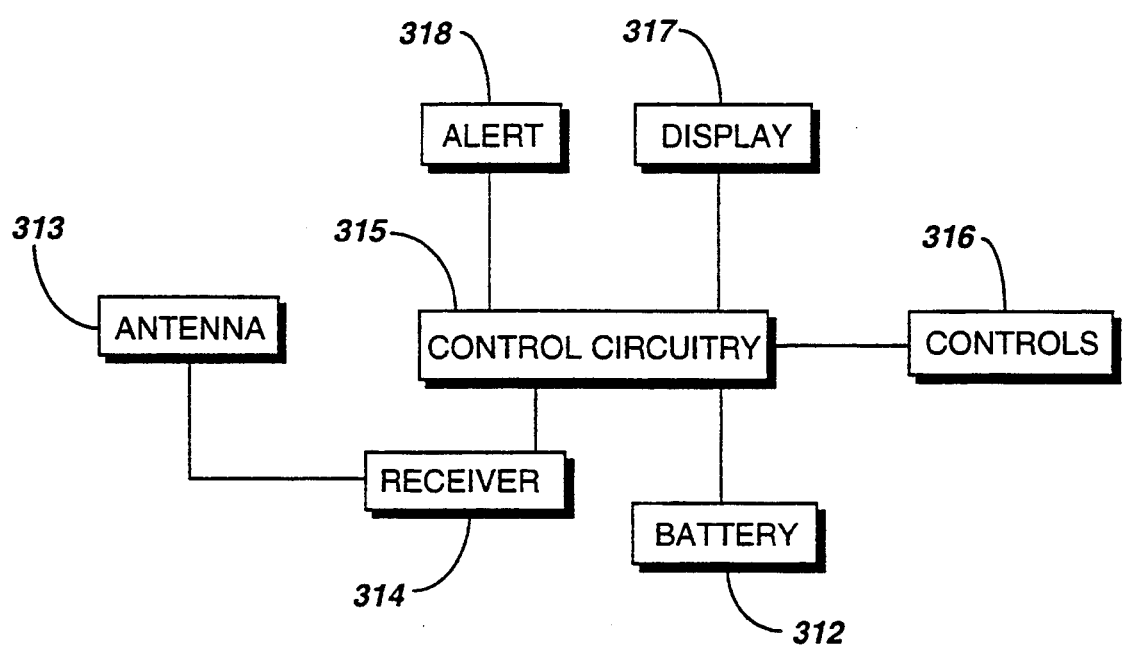
FIG. 3 is a block diagram of a selective call receiver depicted in FIG. 1 system suitable for use with the present invention.

Referring to FIG. 3, a block diagram is shown of a battery 312 powered selective call receiver. The selective call receiver operates to receive a signal via an antenna 313. The received signal is routed from the antenna 313 to a receiver 314. The receiver 314 operates to filter and demodulate the received signal using conventional techniques and forwards a demodulated signal to a control circuitry 315, which decodes and recovers information contained within the received signal. The control circuitry 315 also generates a local oscillator reference frequency using a phase lock loop frequency synthesizer, and also generates a plurality of filter control signals coupled to the receiver 315 for controlling the filtering in the receiver 315. In accordance with the recovered information and user controls 316, the selective call receiver may present at least a portion of the information, such as by a display 317, and may signal the user via a sensible alert 318 that a message has been received.

In the preferred embodiments of both the radio telephone and the selective call receiver, the associated control circuitry 206, 315 may comprise a microprocessor or application specific integrated circuit that implements functions such as a signal processor (e.g., a decoder), a conventional signal multiplexer, a voltage regulator that may supply a regulated voltage to other portions of the radio. Alternatively, the associated control circuitry 206, 315 may include features such as A/D, D/A converters, programmable I/O ports, a control bus, environmental sensing circuitry such as for light or temperature conditions, audio power amplifier circuitry, control interface circuitry, a clock or local oscillator frequency synthesizer, and display illumination circuitry. These elements are typically conventionally assembled to provide the marketable features comprising the radio telephone or selective call receiver requested by a customer.

Figure 4:
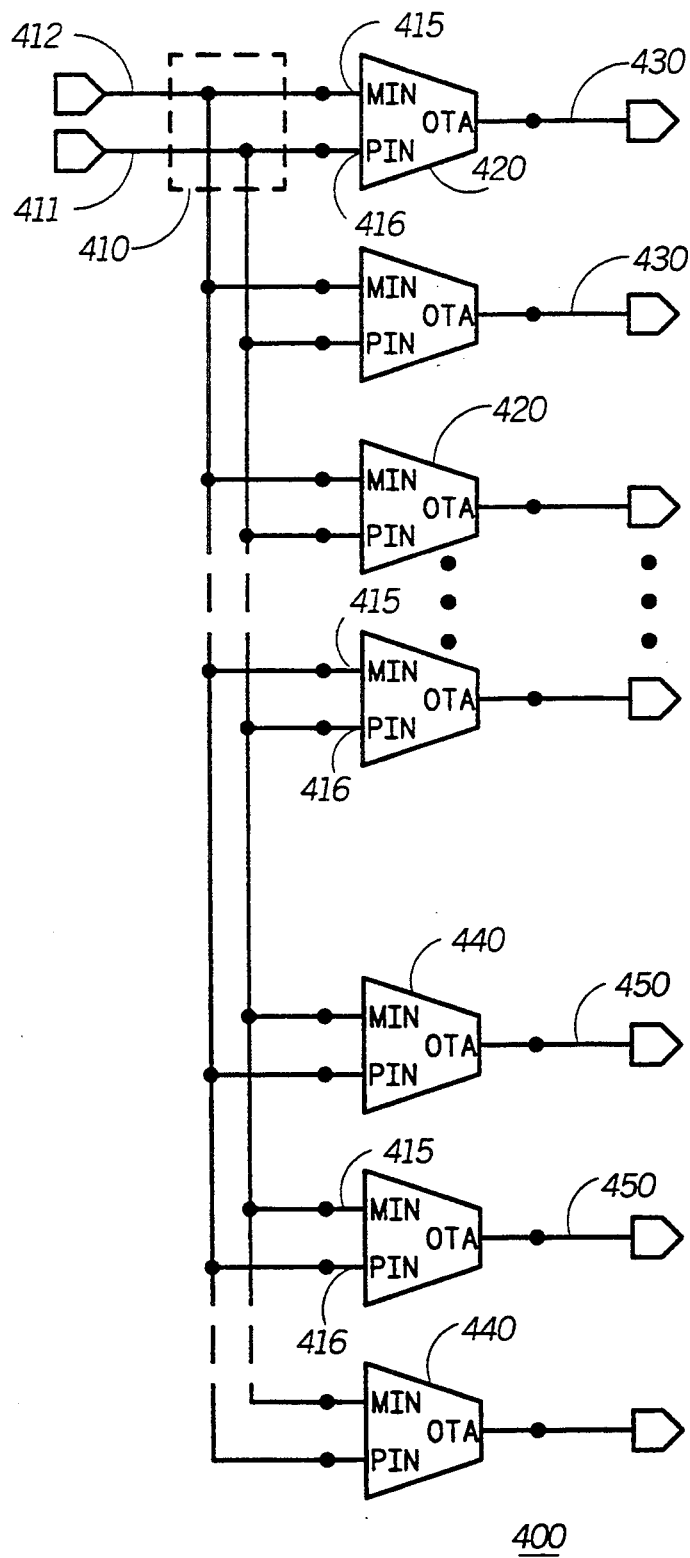
FIG. 4 is an electrical block diagram of a multi-output operational transconductance amplifier used in a radio communication device in accordance with an alternate embodiment of the present invention.

Referring to FIG. 4, an electrical block diagram of a multi-output operational transconductance amplifier (OTA) 400 for use in the display 317 and the display 211 of the above described communication devices (the selective call receiver 106 and the portable radio telephone), the OTA 400 having multiple outputs, is shown in accordance with an alternate embodiment of the present invention. The alternative embodiment of the present invention described herein is an amplifier for driving rows and columns of pixels of the liquid crystal display 317, wherein multiple outputs are required, but it will be appreciated that the OTA 400 is usable in other functions. A circuit input signal is coupled to a circuit input 410 of multioutput OTA 400. The circuit input 410 is a differential input, having a plus input 412 and a minus input 411. The differential input signal is cross-coupled to differential inputs, stage plus inputs 416 (labeled Pin in FIG. 4) and stage minus inputs 415 (labeled Min in FIG. 4), of a plurality of OTA amplifiers 420. Each OTA amplifier 420 generates a non-inverted single ended output signal at the plurality of outputs 430, the magnitude of which is related to a gain of each OTA amplifier 420. The output signals are coupled to the columns of the liquid crystal display 317. The differential input signal is further straight coupled to differential inputs, stage plus inputs 416 and stage minus inputs 415, of a plurality of OTA amplifiers 440. Each OTA amplifier 440 generates an inverted single ended output signal at the plurality of outputs 450, the magnitude of which is related to a gain of each OTA amplifier 440. The output signals are coupled to the rows of the liquid crystal display 317. The output signals are switched on and off by control transistors connected in series in output stages of the OTA stages 420 and 440, in a manner well known in the art.

It will be appreciated that the output signals 430 of the OTAs 420 are inverted with respect to those of the OTAs 440.

It will be further appreciated that the stage inputs and the circuit input 410 can be single ended instead of differential inputs, in which case the OTAs 420 and 440 are single ended input and output stages. Also, when the circuit input 410 is the differential input as shown in FIG. 4, one or more of the OTA stages can be differential input and output stages, thereby providing one or more differential outputs 430 and 450. The OTAs 420 and 440 are comprised of metal oxide semiconductor field effect transistors (MOSFETs) with cascode output stages, the design of which are well known in the art, the MOSFETs preferably on the same substrate. In this alternative embodiment of the present invention, each of the OTAs 420 and 440 has a transconductance gain and offset determined by the transistor geometries, the topography of the interconnections, and material variations. Typically a minimal design offset is desired. Each OTA has a gain error relative to the design gain and an offset error relative to the design offset, which typically differ from output to output.

Figure 5:
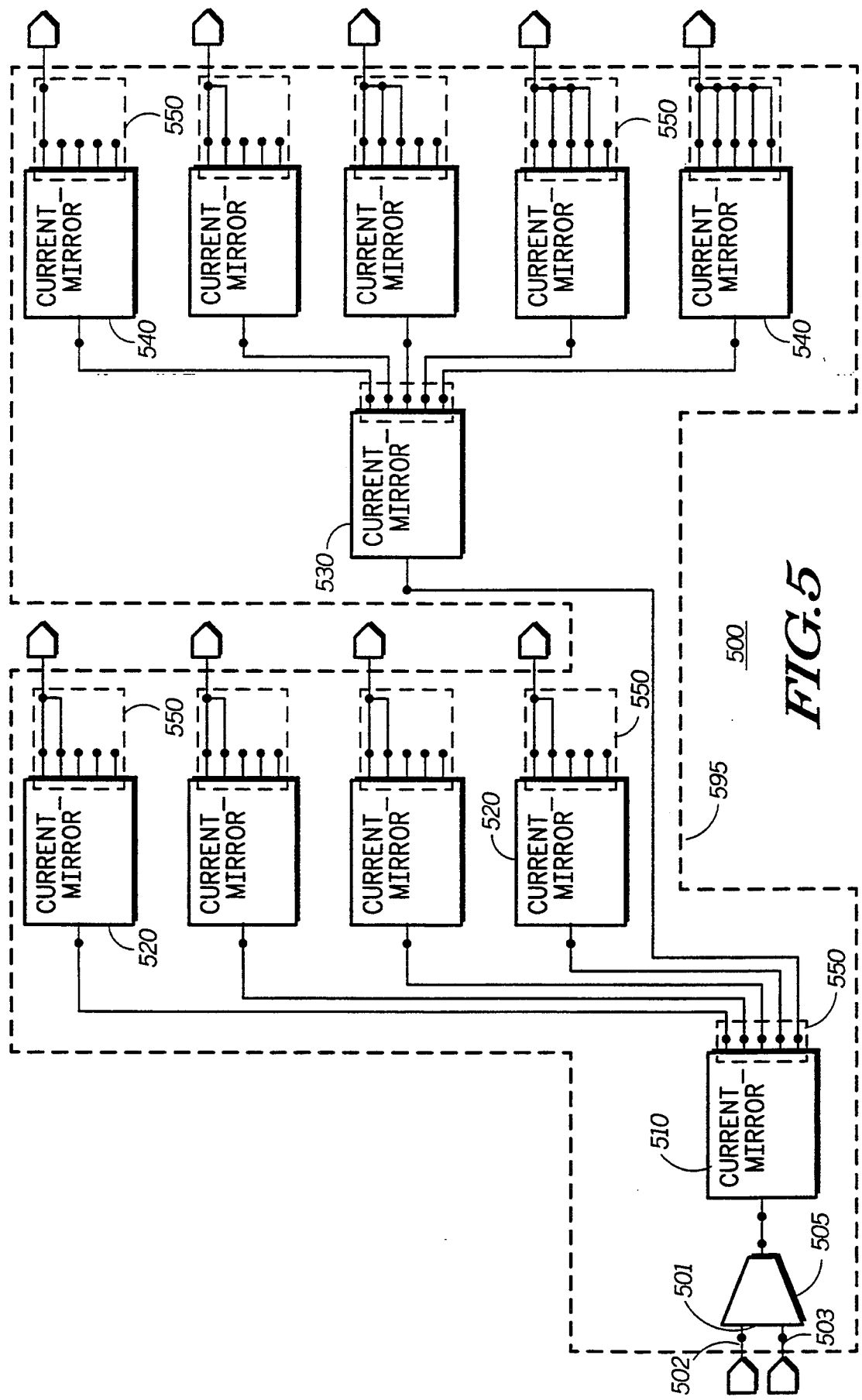
FIG. 5 is an electrical block diagram of a multi-output operational transconductance amplifier for use in a radio communication device in accordance with a preferred embodiment of the present invention.

Referring to FIG. 5, an electrical block diagram of a multi-output operational transconductance amplifier (OTA) 500 for use in the above described communication devices (the selective call receiver 106 and the portable radio telephone), the OTA 500 having multiple outputs, is shown in accordance with a preferred embodiment of the present invention. The preferred embodiment of the present invention described herein is a filter control amplifer for the frequency synthesizer in the control circuitry 206 & 315, wherein a filtered error signal generated by the phase lock loop frequency synthesizer is coupled to a circuit input of the filter control amplifier, and an output of the filter control amplifer is coupled to a current controlled oscillator input of the phase lock loop. In this use, the preferred embodiment of the present invention has a plurality of secondary amplifier outputs, which must be matching outputs, of differing gains, closely tracking the output coupled to the current controlled oscillator, and which are coupled to the receiver 315 for controlling the filtering in the receiver 315. It will be appreciated that the amplifier is equally usable in other functions, such as an amplifier for driving rows and columns of pixels of the liquid crystal display 31.

In the preferred embodiment of the present invention, the filtered error signal is coupled to the circuit input 501 of input OTA 505. The circuit input 501 is a differential input, comprising a plus input 502 and a minus input 503. The input OTA 505 is an OTA stage for generating a first current signal in response to the voltage of the circuit input signal. The first current signal is coupled to a first primary input of a first primary current mirror 2510 which generates a plurality of inverted first primary output signals 550 in response to the first current signal by driving a plurality of first primary output stages from a mirror output driver signal generated within the first primary mirror stage. The inverted first primary output signals are coupled to secondary inputs of individual secondary current mirrors 520, all having the same fundamental gain. Each of the secondary current mirrors 520 generates a plurality of inverted secondary output signals 550 coupled in parallel to generate a single output signal, the magnitude of which is determined substantially by the first primary current output signals coupled thereto, the fundamental gain thereof, and the number of stages coupled in parallel. It can be seen in FIG. 5, by the number of stages coupled in parallel at each secondary current mirror 520, that for the example used herein the relative gains of the inverted secondary output signals illustrated have a ratio 2:3:4:5. One of the secondary output signals is coupled to the current controlled oscillator in the phase lock loop. The other secondary output signals are coupled to the receiver 315 for controlling the filtering in the receiver 315.

One of the first inverted primary output current signals is coupled to a second primary input of a second primary current mirror 530 which generates a plurality of inverted second primary output signals 550 m response to the first primary input signal by driving a plurality of second primary output stages from a mirror output driver signal generated within the second primary mirror stage. The inverted first primary output signals are coupled to secondary inputs of individual secondary current mirrors 540, all having the same fundamental gain. Each of the secondary current mirrors 540 generates a plurality of inverted secondary output signals coupled in parallel to generate a single output signal, the magnitude of which is determined substantially by the first primary current output signals coupled thereto, the fundamental gain thereof, and the number of stages coupled in parallel. It can be seen in FIG. 5, by the number of stages coupled in parallel at each secondary current mirror 540, that for the example used herein the relative gains of the inverted secondary output signals illustrated have a ratio 1:2:3. The secondary output signals are also coupled to the receiver 315 for controlling the filtering in the receiver 315.

The secondary output signals of the secondary current mirrors 520 and 540 may be switched on and off by control transistors connected in series in output stages of the secondary current mirrors 520 and 540, in a manner well known in the art. It will be appreciated that the secondary output signals of the secondary current mirrors 520 are inverted with respect to those of the secondary current mirrors 540, and that in applications where inverted output signals are not required, the second primary mirror 530 and the plurality of secondary mirrors 540 are not required.

It will be further appreciated that the input OTA 505 can have an output which is a differential first current signal, in which case the first primary mirror is a differential input current mirror. It will be further appreciated that the first primary current mirror 510 can have an output which is a differential inverted first primary output current signal, in which case the secondary input of the secondary current mirrors 520 and the second primary input of the second primary mirror are differential inputs. It will be further appreciated that the second primary current mirror 530 can have an output which is a differential inverted second primary output current signal, in which case the secondary input of the secondary current mirrors 540 are differential inputs.

The OTA 505, the primary current mirrors 510 and 530, and the secondary mirrors 520 and 540 are comprised of metal oxide semiconductor field effect transistors (MOSFETs) with cascode output stages, the design of which are well known in the art, with the MOSFETs on the same substrate 595.

It will be appreciated that, because secondary current mirrors 520 share the same input OTA 505 and the same primary current mirror 510, the multiple secondary outputs generated by each of them have a common gain error due to errors in the primary current mirror 510 and also have common offset error due to the primary current mirror 510. The transconductance gain ratios between outputs of the secondary mirrors 520 are related to the matching accuracy of the secondary current mirrors 520, which are designed and can be fabricated to a higher matching accuracy than can be done by using a plurality of OTAs, as in the OTA 400.

It will be further appreciated that the preferred embodiment of the present invention, in utilizing a single input stage, reduces the input capacitance and consequently produces a higher input impedance than with multiple OTAs as described in the alternative embodiment of the present invention described herein.

A plurality of identical inverted secondary output signals coupled in parallel, as described above for the preferred embodiment of the present invention, produces highly matched outputs, but where less precision is acceptable, scaled secondary mirrors (wherein different gains are achieved by means of singular secondary mirror output stages comprising transistors having corresponding different geometries) can be employed providing some economy in integrated circuit layout area.

Thus, it can be seen that the unique combination of a first primary current mirror with a plurality of secondary current mirrors, an optional single input amplifier, and an optional second primary current mirror implemented on the same substrate provides an operational transconductance amplifier having multiple outputs with differing gains but closely matched gain and offset errors.

We claim:

1. A multi-output integrated circuit amplifier comprising:
   a first primary current mirror implemented in a single substrate having a first primary input, said first primary current mirror generating a plurality of first inverted primary current outputs in response to a first current signal coupled to the first primary input; and a plurality of secondary current mirrors implemented in the single substrate, each having a secondary input coupled to a unique one of the plurality of primary current outputs of said first primary current mirror, each of said plurality of secondary current mirrors having a gain, and each of said plurality of secondary current mirrors generating an inverted secondary current output signal, the magnitude of which is determined substantially by the unique one of the plurality of primary current outputs coupled thereto and the gain thereof.

2. The multi-output integrated circuit amplifer according to claim 1, further comprising:

a second primary current mirror implemented in the single substrate having a second primary input coupled to a unique one of the plurality of inverted first primary current outputs of said first primary current mirror, said second primary current mirror generating a plurality of second primary current output signals in response to the first current signal coupled to the first primary input of the first primary mirror.

3. The multi-output integrated circuit amplifer according to claim 2, further comprising:

one or more secondary current mirrors implemented in the single substrate, each having a secondary input coupled to a unique one of the plurality of primary current outputs of said second primary current mirror, each of said one or more secondary current mirrors having a gain, and each of said one or more secondary current mirrors generating an inverted secondary current output signal, the magnitude of which is determined substantially by the unique one of the one or more primary current outputs coupled to said secondary current mirror and the gain of said secondary current mirror.

4. The multi-output integrated circuit amplifier according to claim 1, further comprising:

an input amplifer implemented in the single substrate having a circuit input and an output being the first current signal, the first current signal being coupled to the first primary mirror input, said input amplifier generating the first current signal in response to a voltage of the circuit input signal coupled to the circuit input.

5. The multi-output integrated circuit amplifer according to claim 1, wherein the first primary current mirror is a complementary mirror amplifier, the first primary input being a differential input and one or more of the plurality of first inverted primary current output signals being a first inverted differential primary current output signal.

6. The multi-output integrated circuit amplifier according to claim 1, wherein one or more of the plurality of secondary current mirrors are a complementary mirror amplifier, the secondary input being a differential input and one or more of the plurality of inverted secondary current output signals being an inverted differential secondary current output signal.

7. The multi-output integrated circuit amplifier according to claim 1 wherein the circuit input signal is coupled from a phase lock loop frequency synthesizer included in a control circuit for a radio communication device.

* * * * *